(12) United States Patent
Liu

(10) Patent No.: US 12,363,934 B2
(45) Date of Patent: Jul. 15, 2025

(54) GATE OXIDE FORMATION FOR FIN FIELD-EFFECT TRANSISTOR

(71) Applicant: Micron Technology, Inc., Boise, ID (US)

(72) Inventor: Bingwu Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 508 days.

(21) Appl. No.: 17/732,028

(22) Filed: Apr. 28, 2022

(65) Prior Publication Data

US 2023/0352566 A1 Nov. 2, 2023

(51) Int. Cl.

| H01L 29/76 | (2006.01) |
|---|---|
| H01L 21/768 | (2006.01) |
| H01L 29/94 | (2006.01) |
| H10B 12/00 | (2023.01) |
| H10D 30/01 | (2025.01) |
| H10D 30/62 | (2025.01) |
| H10D 62/10 | (2025.01) |
| H10D 84/01 | (2025.01) |
| H10D 84/03 | (2025.01) |

(52) U.S. Cl.
CPC ..... *H10D 30/024* (2025.01); *H01L 21/76843* (2013.01); *H10B 12/30* (2023.02); *H10D 30/6211* (2025.01); *H10D 62/115* (2025.01); *H10D 84/0151* (2025.01); *H10D 84/0158* (2025.01); *H10D 84/038* (2025.01)

(58) Field of Classification Search
CPC ......... H01L 29/66795; H01L 21/76843; H01L 21/823431; H01L 21/823481; H01L 29/0649; H01L 29/7851; H01L 27/0886; H10B 12/30; H10B 12/50

USPC .......................................................... 257/288
See application file for complete search history.

(56) References Cited

U.S. PATENT DOCUMENTS

| 8,138,543 B2 | 3/2012 | Cheng et al. |
| 8,759,904 B2 | 6/2014 | Wahl et al. |
| 9,589,970 B1 | 3/2017 | Tseng et al. |
| 10,892,222 B1 | 1/2021 | Ding et al. |

(Continued)

FOREIGN PATENT DOCUMENTS

| CN | 117594561 | 2/2024 |
| CN | 117594635 | 2/2024 |
| CN | 117594654 | 2/2024 |

OTHER PUBLICATIONS

U.S. Appl. No. 17/883,919, filed Aug. 9, 2022, Finfets With Reduced Parasitics.

(Continued)

*Primary Examiner* — Theresa T Doan
(74) *Attorney, Agent, or Firm* — Schwegman Lundberg & Woessner, P.A.

(57) ABSTRACT

A variety of applications can include devices implementing one or more fin field-effect transistors (FinFETs) with gate oxide thickness that address thicker gate oxide quality with minimum material loss in the fins of the FinFETs for high voltage devices. The gate oxides can be fabricated with thicker oxides than gate oxides of FinFETs used with capacitors in memory cells of memory arrays. These gate oxides can be formed as oxide liners by oxidation with use of a protective liner to maintain uniform composition of material for the fin during FinFET processing.

20 Claims, 14 Drawing Sheets

(56) References Cited

U.S. PATENT DOCUMENTS

| | | | |
|---|---|---|---|
| 10,957,701 | B1 | 3/2021 | Shen et al. |
| 12,004,341 | B2 | 6/2024 | Hwang et al. |
| 2004/0262676 | A1* | 12/2004 | Lee .................. H01L 29/66795 257/328 |
| 2019/0035938 | A1 | 1/2019 | Park et al. |
| 2019/0165099 | A1 | 5/2019 | Chen et al. |
| 2019/0287971 | A1* | 9/2019 | Lee .................. H01L 29/66795 |
| 2020/0160927 | A1 | 5/2020 | Jung et al. |
| 2021/0083065 | A1 | 3/2021 | Chang et al. |
| 2022/0102366 | A1 | 3/2022 | Su et al. |
| 2023/0317188 | A1 | 10/2023 | Ji |
| 2024/0038314 | A1 | 2/2024 | Chang |
| 2024/0055524 | A1 | 2/2024 | Li |
| 2024/0057317 | A1 | 2/2024 | Hwang et al. |
| 2024/0063114 | A1 | 2/2024 | Lee |

OTHER PUBLICATIONS

U.S. Appl. No. 17/886,917, filed Aug. 12, 2022, Recessed Channel Fin Integration.

U.S. Appl. No. 17/891,523, filed Aug. 19, 2022, Antifuses Using a Finfet Architecture.

Oh, Dongyean, "Industry's First Recessed Gate Transistor Technology for Sense Amplifer Circuit in DRAM: Phenomena of Randomly Threshold Voltage High Flying and Subthreshold Swing Degradation", 2020 IEEE International Electron Devices Meeting (IEDM), (2020), 4 pgs.

"Application Serial No. 17/891,523, Non Final Office Action mailed Feb. 10, 2025", 20 pages.

Khatir, "SOI-Multi-FinFET: Impact of Fins No. multiplicity on Corner Effect", (2014), 5 pages.

Marcyk, Gerald, "High Performance Non-Planar Tri-gate Transistor Architecture", (2002), 22 pages.

\* cited by examiner

US 12,363,934 B2

GATE OXIDE FORMATION FOR FIN FIELD-EFFECT TRANSISTOR

FIELD OF THE DISCLOSURE

Embodiments of the disclosure relate generally to electronic devices and systems and, more specifically, to transistors of electronic devices and systems and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

A 3D fin field-effect transistor (FinFET) device architecture has been widely used in advanced logic technology. A FinFET is a metal-oxide-semiconductor field-effect transistor (MOSFET) constructed with a gate of the FinFET being placed on two, three, or four sides of the channel for the FinFET or wrapped around the channel, forming a double or multi-gate structure. A FinFET is a non-planar transistor device with source and drain regions constructed on a surface with a fin structure, as a channel, on the surface connecting the source region and the drain region. FinFET devices typically enable gate length scaling with its better gate control while also improving device performance. Enhancements to formation of FinFET devices in integrated circuits, such as memory devices or other devices, can provide for higher quality FinFET devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
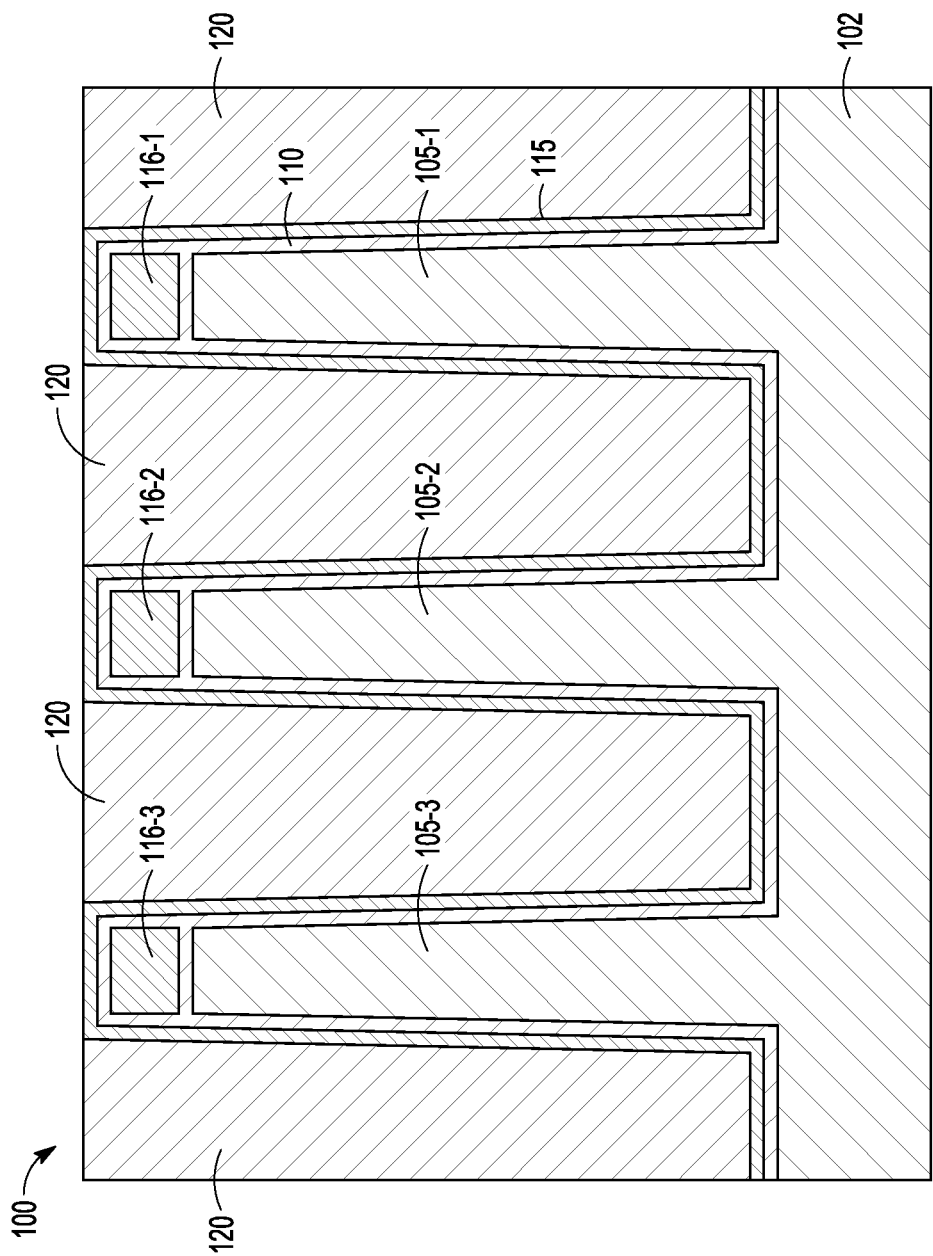
FIGS. 1-3 illustrate features of an example method of forming gate oxides for fin field-effect transistors, in accordance with various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Typically for FinFETs in logic technology, a supply voltage $V_{dd}$ is less than 1.8V for a thick gate device, and the gate oxide thickness is about 30 Å to approximately 40 Å. In the formation of the gate oxide, silicon of the fin can overgo consumption, which includes conversion of portions of the silicon fin to silicon oxide. At the 30 Å to 40 Å level of gate oxide thickness, associated consumption of the silicon of the fin can be at acceptable levels. However, it is difficult to maintain reasonable gate oxide thickness greater than 60 Å with high quality and with acceptable loss of silicon of the fin. With silicon loss above an acceptable threshold level, there can be increased parasitic capacitance at the fin bottom and degraded short channel effects (SCEs). In addition, if the gate oxide fabricated is a deposited oxide, quality of the gate oxide at the increased thickness may not be good. To introduce FinFET devices into DRAM peripheral complementary metal oxide semiconductor (CMOS), the quality of thicker gate oxides with minimum silicon loss, such as for high voltage devices, can be addressed as taught herein.

In various embodiments, a relatively thick gate oxide for FinFET devices can be formed using a dielectric liner to provide a uniform composition of the structure on which the thick gate oxide is located. Portions of the oxide used in the formation of the thick gate oxide combined with the dielectric liner can be maintained below the gate structure in the completed FinFET devices. The dielectric liner can be a protective liner for the oxide material during fabrication, which can be, but is not limited to, a nitride liner. FinFET devices having relatively thick gate oxides can be used in a number of different applications, such as, but not limited to use in peripheral CMOS circuitry to memory arrays in DRAMs.

The gate oxide can be formed by oxidation that can provide oxides of higher quality than by depositing the oxide. Oxidation procedures can include, but are not limited to, situ steam generation (ISSG) or rapid thermal oxidation (RTO). The oxidation procedure for the gate oxide can be conducted in processing of the FinFET using steps that cover and reveal the fin of the FinFET in which the oxidation step is performed before the fin reveal. A protective liner, such as a nitride liner, can be used to protect the thick gate oxide during the fin review process. Such processing can provide for a straighter fin profile, high gate oxide quality, and use of a protective liner to constrain epitaxial (epi) processing.

Figure 2:
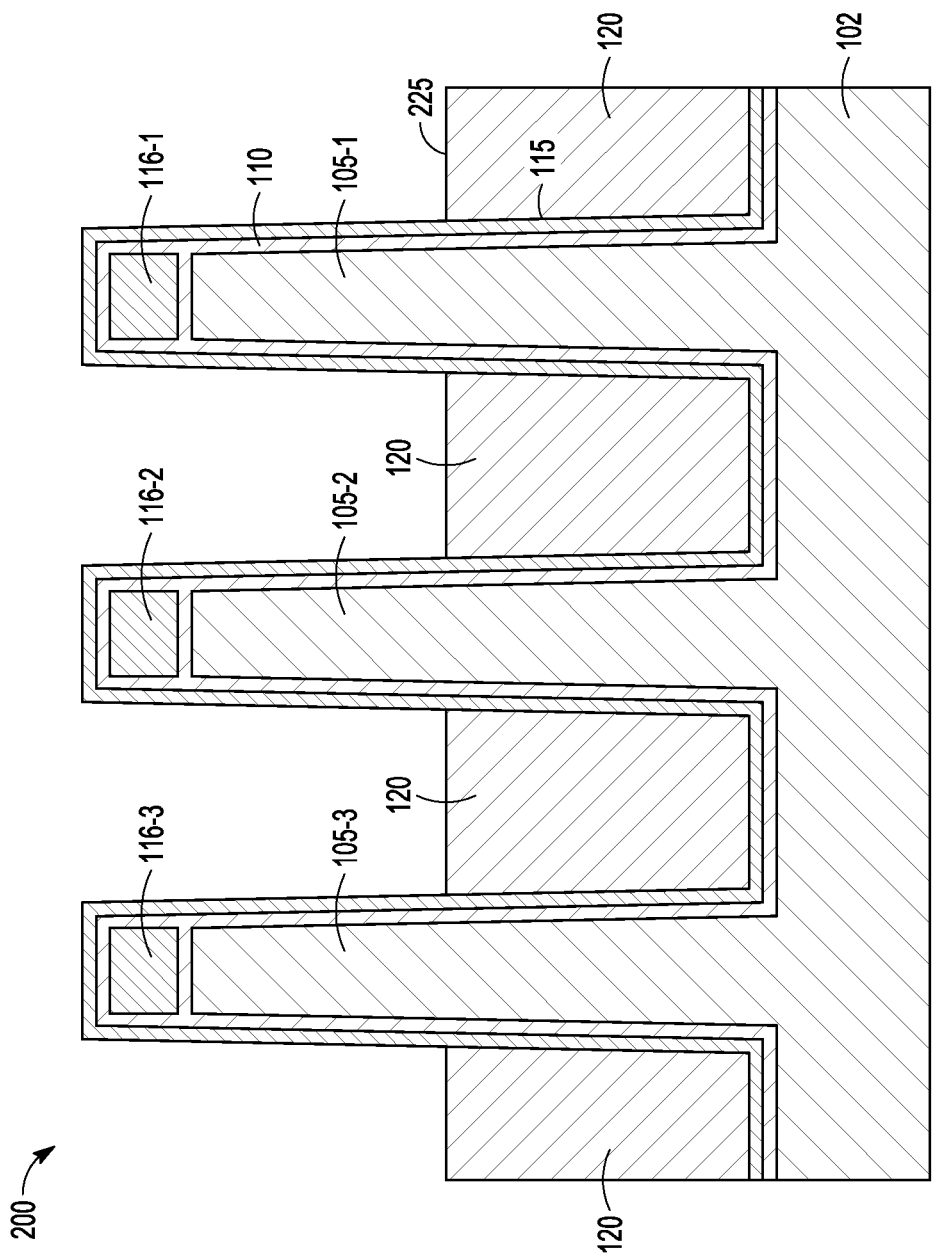
Figure 3:
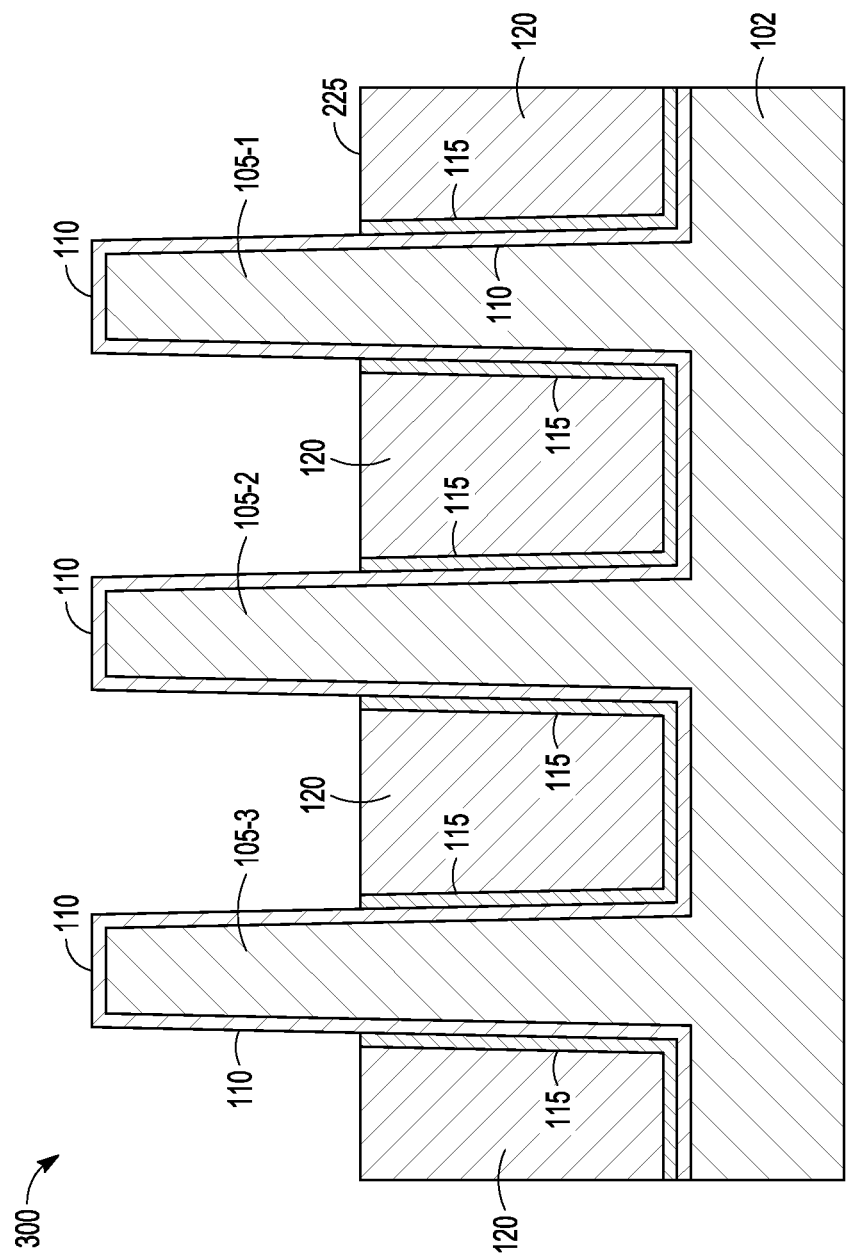

FIGS. 1-3 show features of an embodiment of an example method of forming a gate oxide for FinFETs. Depending on the application, the formed gate oxide can be a relatively thick gate oxide. For example, the formation of the thick gate oxides for the FinFETs can be constructed for application in high voltage components for a DRAM, where high voltage is relative to voltage levels in the memory array of the DRAM. FIG. 1 shows a cross-sectional representation of a structure 100 for FinFETs after fins 105-1, 105-2, and 105-3 have been formed on a substrate 102 for fins 105-1, 105-2, and 105-3. Shallow trench isolations (STIs) about the fins 105-1, 105-2, and 105-3 have been used with the STIs etched and an oxide liner 110 formed, after the STI etch, on fins 105-1, 105-2, and 105-3 including on tops of fins 105-1, 105-2, and 105-3. Protective layers 116-1, 116-2, and 116-3 have been formed on the tops of fins 105-1, 105-2, and 105-3, respectively, and a protective liner 115 has been formed on oxide liner 110 on the sides of fins 105-1, 105-2, and 105-3 that extend vertically from substrate 102. Protective layers 116-1, 116-2, and 116-3 can be formed by different materials than protective layer 115. Alternatively, protective layers 116-1, 116-2, and 116-3 can be formed on the tops of fins 105-1, 105-2, and 105-3, respectively, by the formation of protective layer 115. Protective layers 116-1, 116-2, and 116-3 can be nitride layers and protective liner 115 can be a nitride liner. Though three fins are shown in FIG. 1, structure 100 can be constructed having one or more fins, depending on the application to which one or more FinFETs are being constructed. Fins 105-1, 105-2, and 105-3 are bodies that extend vertically from a substrate for the fins, such as substrate 102, where the fins 105-1, 105-2, and 105-3 are separate from each other. The material of the fins 105-1, 105-2, and 105-3 can be the same as the material for substrate 102. Fins 105-1, 105-2, and 105-3 can be silicon fins with substrate 102 being silicon-based.

As shown in FIG. 1, in formation of structure 100, gap fill material 120 has been formed in the gaps created by removal of the STIs, and a chemical mechanical planarization (CMP) has been applied to provide a uniform surface to structure 100. The result of the CMP can include top surfaces of protective layer 115 being exposed with gap fill material 120 also planarized.

Formation of fins 105-1, 105-2, and 105-3 with STIs and removal of the STIs can be performed by one of a number of different techniques. To prevent excessive material loss of the fins that results in non-uniform density of the fins, oxide liner 110 can be formed by oxidation rather than forming a deposited oxide on fins 105-1, 105-2, and 105-3. With material of fins 105-1, 105-2, and 105-3 being silicon, oxide liner 110 is silicon oxide. Oxidation applied to fins 105-1, 105-2, and 105-3 to form oxide liner 110 can be performed by ISSG, RTO, other oxidation techniques, or combinations of oxidations.

Formation of protective layers 116-1, 116-2, and 116-3 and protective liner 115 can be performed by one or more typical methods suitable to form these regions as protective regions to oxide liner 110 that are compatible with the material of oxide liner 110. Protective layers 116-1, 116-2, and 116-3 and protective liner 115 can be formed by one or more deposition processes including, but not limited to, chemical vapor deposition or atomic layer deposition. In addition, gap fill material 120 can be formed by one or more different techniques.

FIG. 2 shows a cross-sectional representation of a structure 200 after removing a portion of the gap fill material 120, previously formed in gaps between fins 105-1, 105-2, and 105-3, of structure 100 of FIG. 1. Removal of the portion of the gap fill material 120 has revealed a portion of combinations of fins 105-1, 105-2, and 105-3 with oxide liner 110 on fins 105-1, 105-2, and 105-3 and protective liner 115 on oxide liner 110. The revealed portion extends down from protective liner 115 on tops of fins 105-1, 105-2, and 105-3 to a surface 225 of the gap fill material 120. On the level of surface 225, there is no oxide liner horizontally connecting fins 105-1, 105-2, and 105-3 to each other. Below the level of surface 225, gap fill material 120 remains on protective liner 115 on oxide liner 110 between fins 105-1, 105-2, and 105-3 and around each of fins 105-1, 105-2, and 105-3, including on protective liner 115 on oxide liner 110 disposed on the substrate 102 for fins 105-1, 105-2, and 105-3 connected horizontally by oxide liner 110 on substrate 102.

FIG. 3 shows a cross-sectional representation of a structure 300 after portions of protective liner 115 and protective layers 116-1, 116-2, and 116-3 have been removed from oxide liner 110 of structure 200 of FIG. 2. These protective materials have been removed from the revealed portion of combinations of fins 105-1, 105-2, and 105-3 with oxide liner 110 on fins 105-1, 105-2, and 105-3 and protective liner 115 on oxide liner 110 above surface 225. After removal of these protective materials above surface 225, oxide liner 110 remains on each of fins 105-1, 105-2, and 105-3, but, in this example procedure, does not connect each of fins 105-1, 105-2, and 105-3 with an adjacent one of each of fins 105-1, 105-2, and 105-3 above surface 225.

Structure 300 can be further processed to form active regions for FinFETs on gap fill material 120 above surface 225. Below surface 225, oxide liner 110 on substrate 102 with protective liner 115 on oxide liner 110 remains, where protective liner 115 separates oxide liner 110 from gap fill material 120 in the regions below the level of surface 225. Gates for a FinFET can be formed adjacent oxide liner 110 on fins 105-1, 105-2, and 105-3, after removing protective liner 115 from oxide liner 110 of the revealed portion. The gates can be formed above a level of surface 225 formed from removing the portion of the gap fill material 120. Material for the gates can be formed on oxide liner 110 on the sides and top of fins 105-1, 105-2, and 105-3 and on surface 225 between fins 105-1, 105-2, and 105-3. For FinFETs not to be coupled together, further processing can be conducted to form non-conductive regions between the gates of the FinFETs. Alternatively, masking processes can be used to form the gates for FinFETs conductively separated from each other. Source and drain regions can be formed connected to opposite ends of fins 105-1, 105-2, and 105-3 on the surface 225. Source and drain regions are not shown in FIG. 3 to focus on the formation of the oxide liner for the FinFETs.

Figure 4:
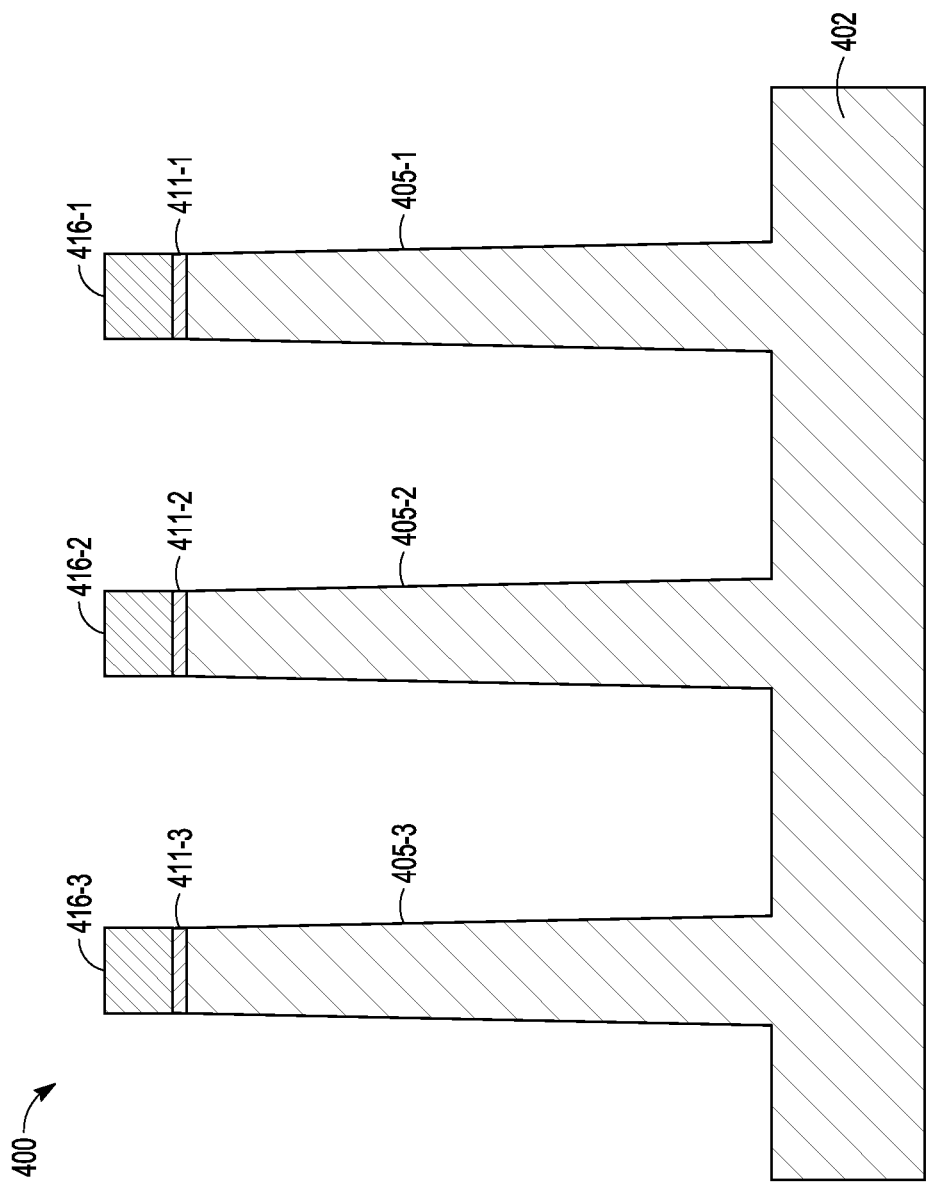
FIGS. 4-8 illustrate features of another example method of forming gate oxides for fin field-effect transistors, in accordance with various embodiments.

FIGS. 4-8 illustrate features of an embodiment of another example method of forming a gate oxide for FinFETs. Depending on the application, the formed gate oxide can be a relatively thick gate oxide. For example, the formation of the thick gate oxides for the FinFETs can be constructed for application in high voltage components for a DRAM, where high voltage is relative to voltage levels in the memory array of the DRAM. FIG. 4 shows a cross-sectional representation of a structure 400 after fins 405-1, 405-2, and 405-3 have been formed having oxide layers 411-1, 411-2, and 411-3 on tops of fins 405-1, 405-2, and 405-3, respectively, with protective layers 116-1, 116-2, and 116-3 on oxide layers 411-1, 411-2, and 411-3, respectively. Protective layers 416-1, 416-2, and 416-3 can be nitride layers. Though three fins are shown in FIG. 4, structure 400 can be constructed having one or more fins, depending on the application to which the one or more FinFETs are being constructed. Fins 405-1, 405-2, and 405-3 are bodies that extend vertically from a substrate for the fins, such as substrate 402, where the fins 405-1, 405-2, and 405-3 are separate from each other. The material of the fins 405-1, 405-2, and 405-3 can be the same as the material for substrate 402. Fins 405-1, 405-2, and 405-3 can be silicon fins with substrate 402 being silicon-based.

Formation of fins 405-1, 405-2, and 405-3 with the corresponding top oxide layers and top protective layers with STIs and removal of the STIs can be performed by a number of different techniques. Fins 405-1, 405-2, and 405-3 with the corresponding oxide layers and protective layers can be formed within STIs about the fins 405-1, 405-2, and 405-3, with the STIs removed, for example, by etching. With the STIs removed, fins 405-1, 405-2, and 405-3 can extend vertically from substrate 402 for fins 405-1, 405-2, and 405-3, with fins 405-1, 405-2, and 405-3 having a uniform composition above substrate 402.

Figure 5:
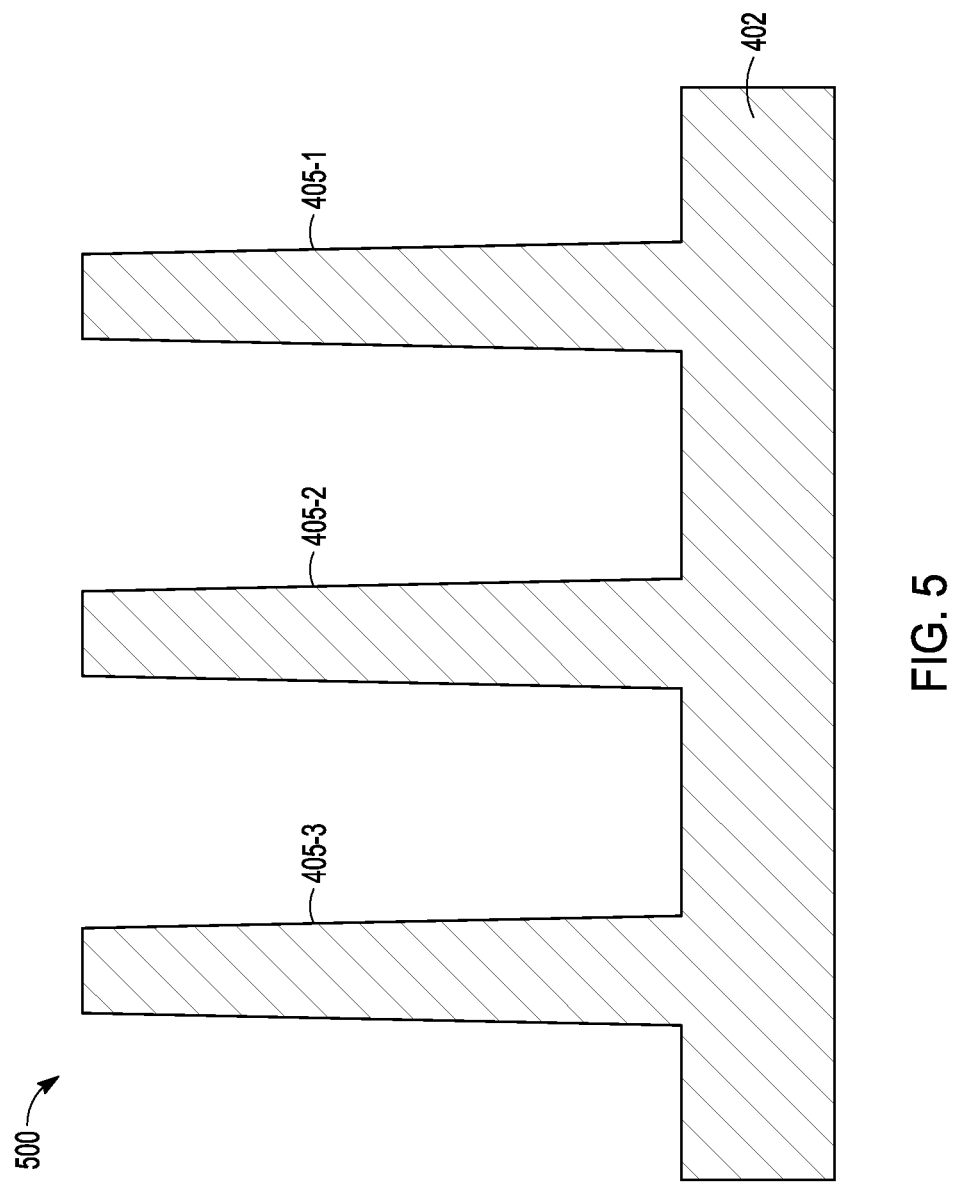

FIG. 5 shows a cross-sectional representation of a structure 500 after protective layers 116-1, 116-2, and 116-3 and oxide layers 411-1, 411-2, and 411-3 of structure 400 of FIG. 4 have been removed. After removal of the oxide and protective layers, fins 405-1, 405-2, and 405-3 extend from substrate 402 for fins 405-1, 405-2, and 405-3, where each of fins 405-1, 405-2, and 405-3 is separated from each other and openings between fins 405-1, 405-2, and 405-3 extend to substrate 402 for fins 405-1, 405-2, and 405-3. Fins 405-1, 405-2, and 405-3 can be uniformly structured extending vertically from substrate 402.

Figure 6:
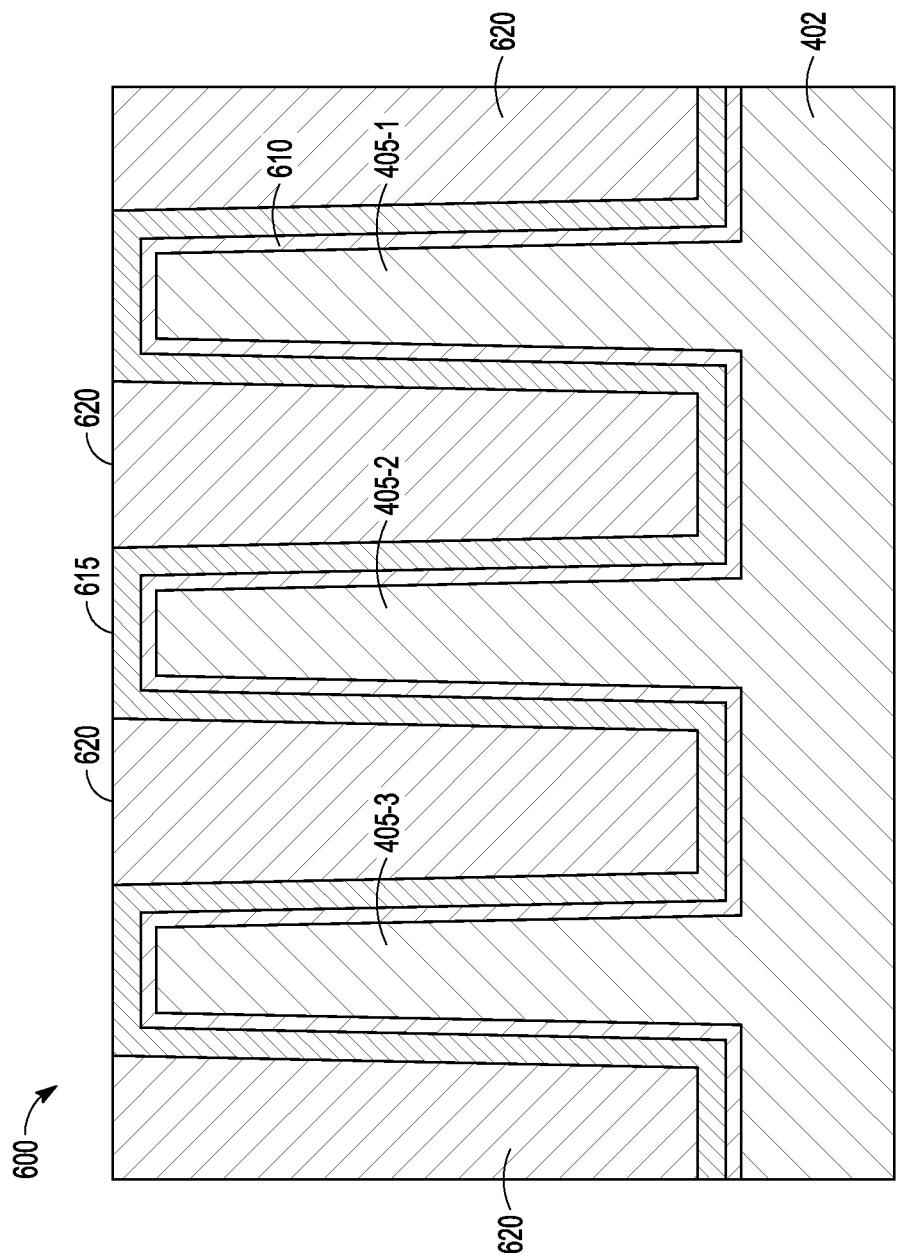

FIG. 6 shows a cross-sectional representation of a structure 600 after an oxide liner 610 has been formed on fins 405-1, 405-2, and 405-3 of structure 500 of FIG. 5. Oxide liner 610 has been formed on the sides of fins 405-1, 405-2, and 405-3, the tops of fins 405-1, 405-2, and 405-3, and on the surface of substrate 402 between fins 405-1, 405-2, and 405-3. In addition, a protective liner 615 has been formed on all sections of oxide liner 610, and gap fill material 620 has been formed on protective liner 615 filling the openings previously formed between fins 405-1, 405-2, and 405-3. A CMP has been applied to provide a uniform surface to structure 600. The result of the CMP can include top surfaces of protective liner 615 being exposed with gap fill material 620 between these top surfaces also planarized.

To prevent excessive material loss of the fins that results in non-uniform density of the fins, oxide liner 610 can be formed by oxidation rather than forming a deposited oxide on fins 405-1, 405-2, and 405-3. With material of fins 405-1, 405-2, and 405-3 being silicon, oxide liner 610 is silicon oxide. Oxidation applied to fins 405-1, 405-2, and 405-3 to form oxide liner 610 can be performed by ISSG, RTO, other oxidation techniques, or combinations of oxidations. Formation of oxide liner 610 on the sides of fins 405-1, 405-2, and 405-3, the tops of fins 405-1, 405-2, and 405-3, and on the surface of substrate 402 between fins 405-1, 405-2, and 405-3 of structure 500 allows the oxide liner 610 to be formed thicker that oxide liner 110 of structures 100, 200, and 300 of FIGS. 1-3.

Formation of protective liner 615 can be performed by one or more typical methods suitable to form these regions as protective regions to oxide liner 610 that are compatible with the material of oxide liner 610. Protective liner 615 can be formed by one or more deposition processes including, but not limited to, chemical vapor deposition or atomic layer deposition. In addition, gap fill material 620 can be formed by one or more different techniques.

Figure 7:
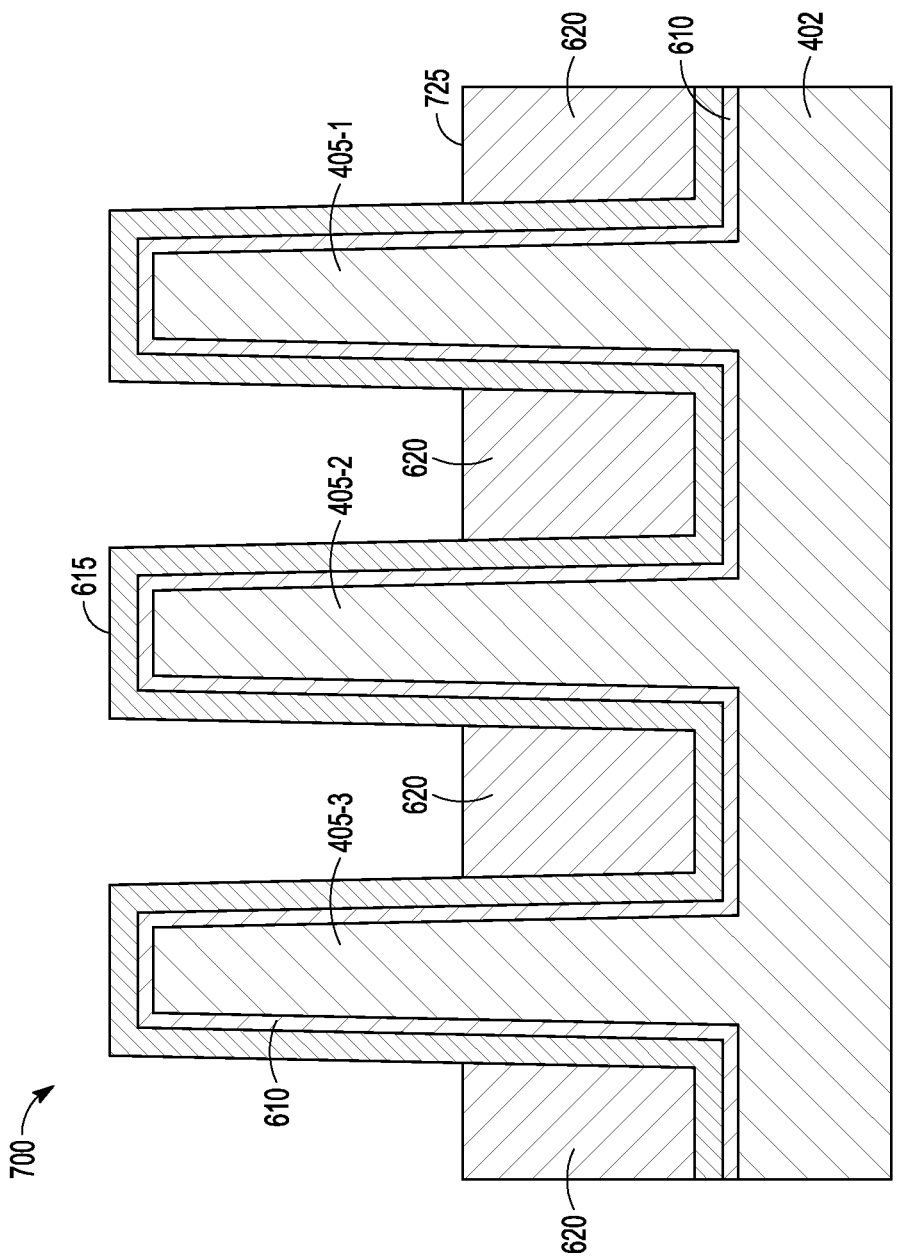

FIG. 7 shows a cross-sectional representation of a structure 700 after structure 600 of FIG. 6 has further processed. A portion of the gap fill material 620 previously formed in gaps between fins 405-1, 405-2, and 405-3 has been removed. Removal of the portion of the gap fill material 620 has revealed a portion of combinations of fins 405-1, 405-2, and 405-3 with oxide liner 610 on fins 405-1, 405-2, and 405-3 and protective liner 615 on oxide liner 610. The revealed portion extends down from protective liner 615 on tops of fins 405-1, 405-2, and 405-3 to a surface 725 of the gap fill material 620. On the level of surface 725, there is no oxide liner horizontally connecting fins 405-1, 405-2, and 405-3 to each other. Below the level of surface 725, gap fill material 620 remains on protective liner 615 on oxide liner 610 between fins 405-1, 405-2, and 405-3 and around each of fins 405-1, 405-2, and 105-3, including on protective liner 615 on oxide liner 610 disposed on the substrate 402 for fins 405-1, 405-2, and 405-3 connected horizontally by oxide liner 610 on substrate 402.

Figure 8:
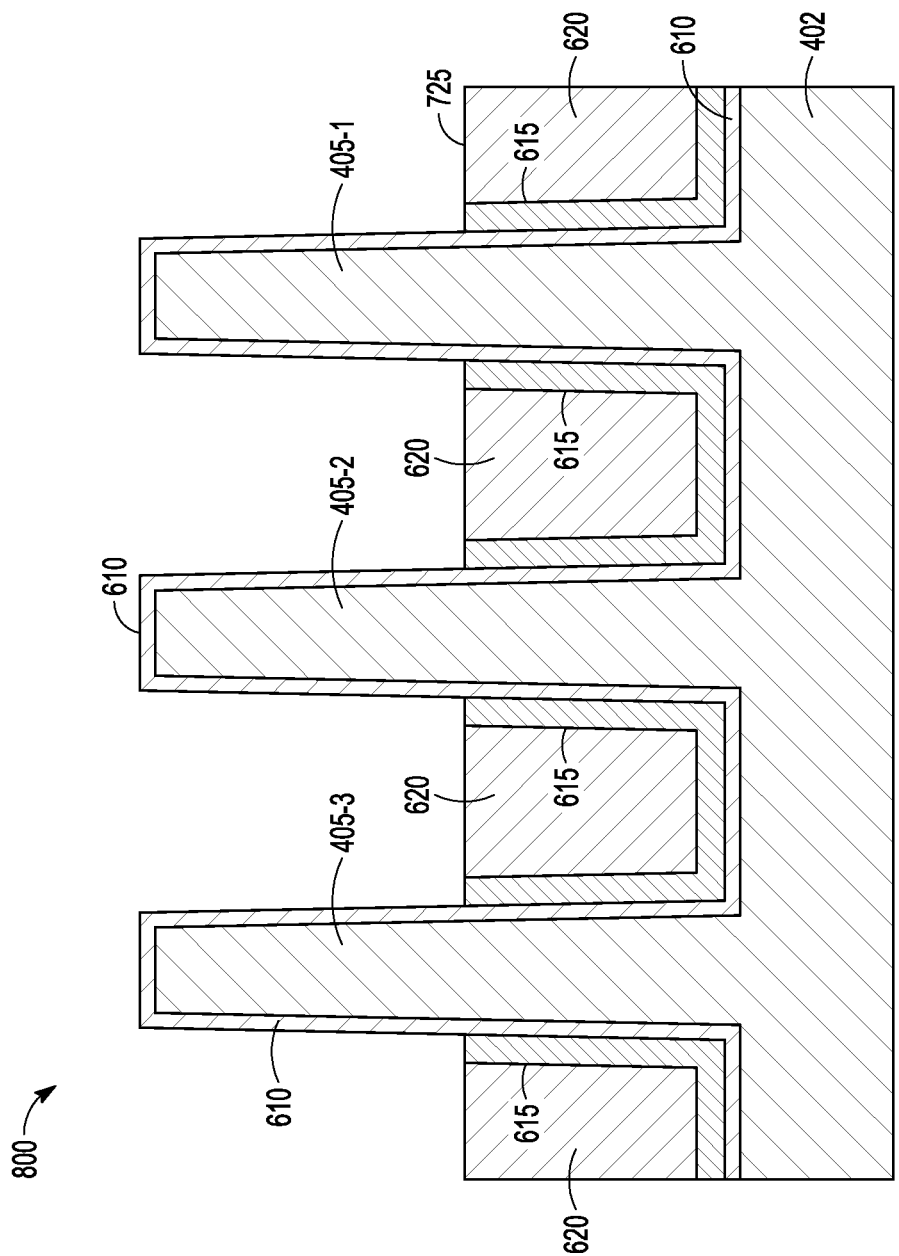

FIG. 8 shows a cross-sectional representation of a structure 800 after portions of protective liner 615 have been removed from oxide liner 610 of structure 700 of FIG. 7. The portions of protective liner 615 have been removed from the revealed portion of FIG. 7 of combinations of fins 405-1, 405-2, and 405-3 with oxide liner 610 on fins 405-1, 405-2, and 405-3 and protective liner 615 on oxide liner 610 above surface 725. After removal of these protective materials above surface 725, oxide liner 610 remains on each of fins 405-1, 405-2, and 405-3, but does not connect each of fins 405-1, 405-2, and 405-3 with an adjacent one of each of fins 405-1, 405-2, and 405-3 above surface 725.

Structure 800 can be further processed to form active regions for FinFETs on gap fill material 620 above surface 725. The regions below surface 725 continue to include oxide liner 610 on substrate 402 with protective liner 615 on oxide liner 610. Protective liner 615 separates oxide liner 610 from gap fill material 620 in the regions below the level of surface 725. Gates for FinFETS can be formed adjacent oxide liner 610 on fins 405-1, 405-2, and 405-3, after removing protective liner 615 from oxide liner 610 of the revealed portion. The gates can be formed above the level of surface 725. Material for the gates can be formed on oxide liner 610 on the sides and top of fins 405-1, 405-2, and 405-3 and on surface 725 between fins 405-1, 405-2, and 405-3 above the level of surface 725. For FinFETs not to be coupled together in the completed integrated circuit, further processing can be conducted to form non-conductive regions between the gates of the FinFETs. Alternatively, masking processes can be used to form the gates for FinFETs conductively separated from each other. Source and drain regions can be formed connected to opposite ends of fins 405-1, 405-2, and 405-3 on the surface 725. Source and drain regions are not shown in FIG. 8 to focus on the formation of the oxide liner for the FinFETs.

The material and fabrication processes can be selected to meet the architecture of the FinFET being formed or the device in which the FinFET is being formed. In addition, deposition techniques for structures other than oxide liners, formed by oxidation, can be used that are typical for the material being formed, the dimensions of the material being formed, and the architecture in which the material is being formed. Selective etching can be used to remove selected regions in the processing discussed with respect to FIGS. 1-3 and FIGS. 4-8. Selective etching is a process in which one or more materials are removed from a structure, while one or more other materials remain in the structure with no or little removal. Selective etching can depend on the material to be etched, the material not to be etched, the etchant employed, and the method for etching. Types of etching include wet etching and dry etching, where each of these two basic methods include a number of different etching procedures. In addition, conventional masking techniques can be used in removal of selected regions in forming an oxide line as a thick gate oxide for a FinFET.

Figure 9:
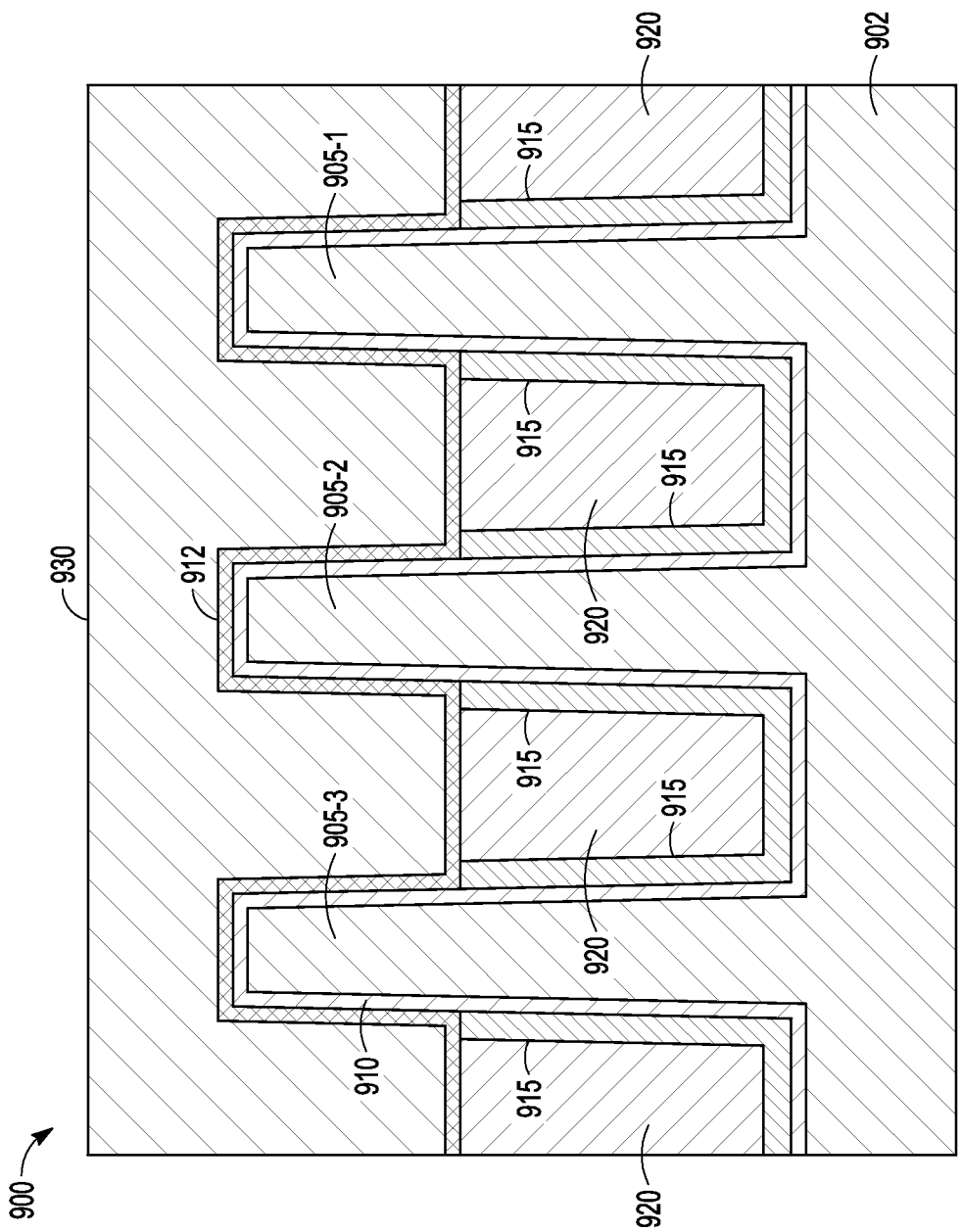
FIG. 9 illustrates a cross-sectional representation of an example structure of a gate formed on an oxide liner for fin field-effect transistors similar to oxide liner of FIG. 3 and oxide liner of FIG. 8, in accordance with various embodiments.

FIG. 9 illustrates a cross-sectional representation of an embodiment of an example structure 900 of a gate 930 formed on an oxide liner 910 of FinFETs similar to oxide liner 110 of structure 300 above surface 225 of FIG. 3 and oxide liner 610 above surface 725 of structure 800 of FIG. 8. Structure 900 includes fins 905-1, 905-2, and 905-3 extending from substrate 902 for fins 905-1, 905-2, and 905-3. Though three fins are shown, a structure similar to structure 900 can be structured with one or more fins. Oxide liner 910 is formed on the surface of substrate 902 between fins 905-1, 905-2, and 905-3, along the sides of fins 905-1, 905-2, and 905-3, and on the tops of fins 905-1, 905-2, and 905-3. Protective liner 915 is disposed on oxide liner 910 on the surface of substrate 902 and on oxide liner 910 vertically disposed from substrate 902 to a level below the tops of fins 905-1, 905-2, and 905-3. The level at which protective liner 915 terminates vertically is defined by the region for gate 930 to be adjacent oxide liner 610. Gap fill material 920 is disposed adjacent protective liner 915 below gate 930. Structure 900 can be used for FinFETs structured with a high-k dielectric 912 on oxide liner 910 separating oxide liner 910 from gate 930 for the FinFETs. A high-k dielectric is a dielectric that has a dielectric constant greater than that of silicon dioxide. High-k dielectric 912 can be formed on the oxide liner 910, after removing the protective liner 915 from the oxide liner 910 of revealed portions in processing such as in methods associated with FIGS. 1-3 and FIGS. 4-8.

Figure 10:
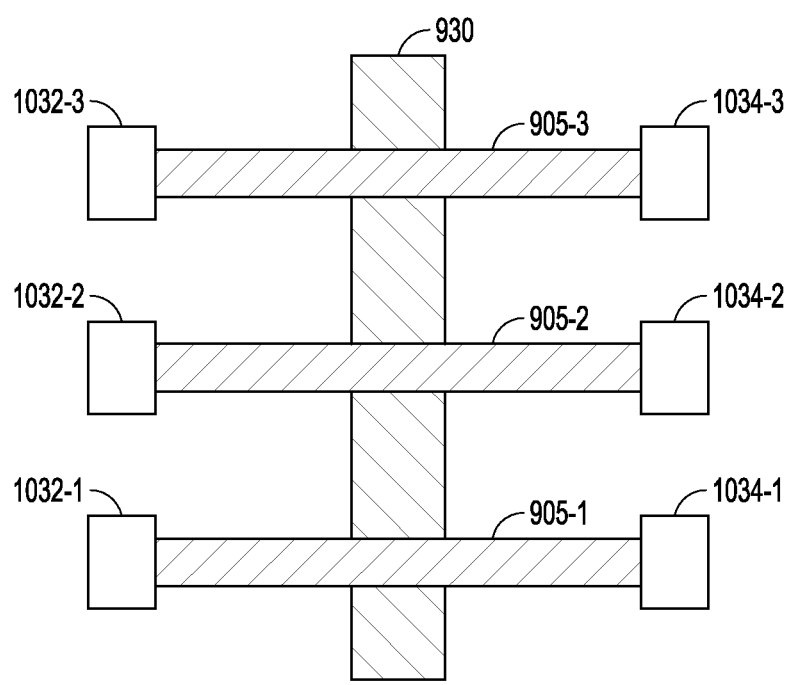
FIG. 10 illustrates a top view of the three fins and associated gate of FIG. 9, in accordance with various embodiments.

FIG. 10 illustrates a top view of the three fins 905-1, 905-2, and 905-3 and associated gate 930 of FIG. 9. In addition, source 1032-1 and drain 1034-1 are shown for fin 905-1. Source 1032-2 and drain 1034-2 are shown for fin 905-2. Source 1032-3 and drain 1034-3 are shown for fin 905-3. Gate 930 is shown common to each of fins 905-1, 905-2, and 905-3. However, gate 930 can be separated into three gate sections separated by dielectric material such that FinFETS associated with fins 905-1, 905-2, and 905-3 are isolated from each other.

Figure 11:
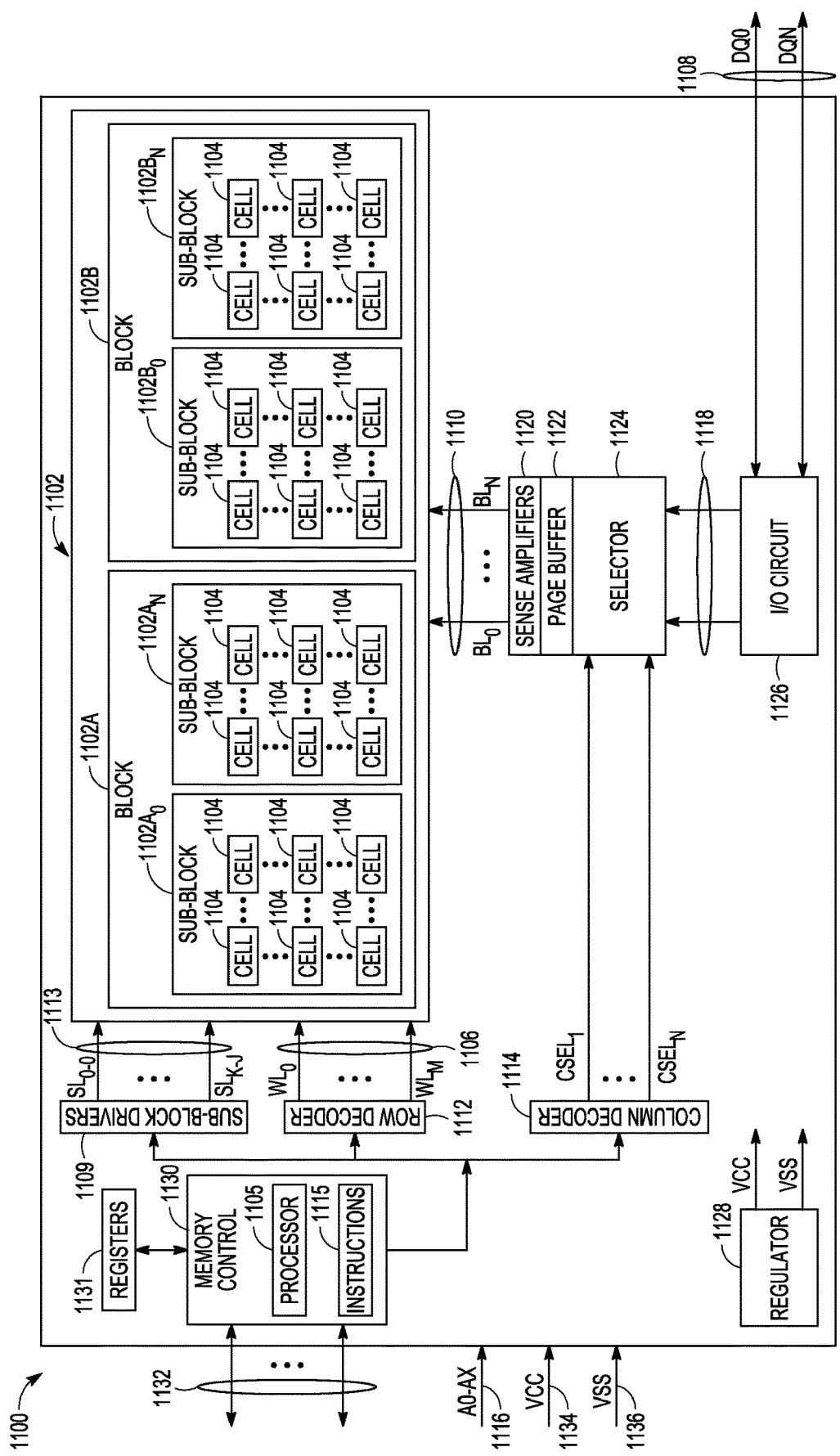
FIG. 11 illustrates a functional block diagram of an example memory device including a memory array having a plurality of memory cells, and one or more circuits or components to provide communication with, or perform one or more memory operations on, the memory array, according to various embodiments.

FIG. 11 illustrates an example block diagram of a memory device 1100 including a memory array 1102 having a plurality of memory cells 1104, and one or more circuits or components to provide communication with, or perform one or more memory operations on, the memory array 1102. The memory device 1100 can include one or more FinFETS constructed and having a structure as discussed with respect to FIGS. 1-10. The memory cells 1104 can be formed in vertical structures coupled to data lines formed using a metal line deposition process, where these data lines couple to or are a part of data lines 1110 coupled to sense amplifiers 1120. The memory device 1100 can be a memory die, for example, a DRAM memory die. The memory device 1100 can include a row decoder 1112, a column decoder 1114, sub-block drivers 1109, the sense amplifiers 1120, a page buffer 1122, a selector 1124, an I/O circuit 1126, and a memory controller 1130. Thick gate oxide FinFETs, as discussed above, can be used in higher voltage applications for memory device 1100 such as sub-block drivers 1109, row decoder 1112, column decoder 1114, and I/O circuit 1126. A relatively thick gate oxide can be formed by oxidation, where the thickness is relative to thin gate oxides for FinFETs for memory cell capacitors of DRAMs.

The memory controller 1130 can include processing circuitry, including one or more processors 1105, and can be configured to perform operations of the memory device 1100 by executing instructions 1115. The memory controller 1130 can be coupled to registers 1131 that can contain parameter data for the memory controller 1130. For purposes of the present example, the instructions 1115 may be performed by memory within or dedicated to memory controller 1130. In other examples, at least some portion of the instructions executed by memory controller 1130 may be stored in other memory structures and loaded, for example, into local (memory controller) memory for execution by the memory controller 1130.

The memory cells 1104 of the memory array 1102 can be arranged in blocks, such as first and second blocks 1102A, 1102B. Each block can include sub-blocks. For example, the first block 1102A can include first and second sub-blocks 1102A$_0$, 1102A$_N$, and the second block 1102B can include first and second sub-blocks 1102B$_0$, 1102B$_N$. Each sub-block can include a number of physical pages, with each page including a number of memory cells 1104. Although illustrated herein as having two blocks, with each block having two sub-blocks, and each sub-block having a number of memory cells 1104, in other examples, the memory array 1102 can include more or fewer blocks, sub-blocks, memory cells, etc. In other examples, the memory cells 1104 can be arranged in a number of rows, columns, pages, sub-blocks, blocks, etc., and accessed using, for example, access lines 1106, data lines 1110, or one or more select gates, source lines, etc.

The memory controller 1130 can control memory operations of the memory device 1100 according to one or more signals or instructions received on control lines 1132, including, for example, one or more clock signals or control signals that indicate a desired operation (e.g., write, read, erase, etc.), or address signals (A0-AX) received on one or more address lines 1116. One or more devices external to the memory device 1100 can control the values of the control signals on the control lines 1132 or the address signals on the address line 1116. Examples of devices external to the memory device 1100 can include, but are not limited to, a host, an external memory controller, a processor, or one or more circuits or components not illustrated in FIG. 11.

The memory device 1100 can use access lines 1106 and data lines 1110 to transfer data to (e.g., write or erase) or from (e.g., read) one or more of the memory cells 1104. The row decoder 1112 and the column decoder 1114 can receive and decode the address signals (A0-AX) from the address line 1116, determine which of the memory cells 1104 are to be accessed, and provide signals to one or more of the access lines 1106 (e.g., one or more of a plurality of access lines (WL$_0$-WL$_M$)) or the data lines 1110 (e.g., one or more of a plurality of data lines (BL0-BLN)), such as described above. The memory device 1100 can include sense circuitry, such as the sense amplifiers 1120, configured to determine the values of data on (e.g., read), or to determine the values of data to be written to, the memory cells 1104 using the data lines 1110.

One or more devices external to the memory device 1100 can communicate with the memory device 1100 using the I/O lines (DQ0-DQN) 1108, address lines 1116 (A0-AX), or control lines 1132. The I/O circuit 1126 can transfer values of data in or out of the memory device 1100, such as in or out of the page buffer 1122 or the memory array 1102, using the I/O lines 1108, according to, for example, the control lines 1132 and address lines 1116. The page buffer 1122 can store data received from the one or more devices external to the memory device 1100 before the data is programmed into relevant portions of the memory array 1102, or can store data read from the memory array 1102 before the data is transmitted to the one or more devices external to the memory device 1100.

The column decoder 1114 can receive and decode address signals (A0-AX) into one or more column select signals ($CSEL_1$-$CSEL_N$). The selector 1124 (e.g., a select circuit) can receive the column select signals ($CSEL_1$-$CSEL_N$) and select data in the page buffer 1122 representing values of data to be read from or to be programmed into memory cells 1104. Selected data can be transferred between the page buffer 1122 and the I/O circuit 1126 using second data lines 1118.

The memory controller 1130 can receive positive and negative supply signals, such as a supply voltage (Vcc) 1134 and a negative supply (Vss) 1136 (e.g., a ground potential) with respect to Vcc, from an external source or supply (e.g., an internal or external battery, an alternating current (AC) to direct current (DC) converter, etc.). In certain examples, the memory controller 1130 can include a regulator 1128 to internally provide positive or negative supply signals.

To program or write data to a memory cell, a programming voltage (VPGM) (e.g., one or more programming pulses, etc.) can be applied to selected access lines (e.g., $WL_i$), and, thus, to a control gate of each memory cell coupled to the selected access lines. Magnitude of the programming pulses depends on the architecture of memory device 1100. A Vpass can be applied to one or more access lines having memory cells that are not targeted for programming, or an inhibit voltage (e.g., Vcc) can be applied to data lines having memory cells that are not targeted for programming. The pass voltage can be variable, depending on the architecture of memory device 1100.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective. To erase a memory cell or a group of memory cells (e.g., erasure is typically performed in blocks or sub-blocks), an erasure voltage (Vers) can be applied.

When a host, which is a user device, sends an address to the memory device 1100, it typically can have an identification of a block, a page, and a column. The identification of the block is used to select the block of interest in the operation. The identification of the page is used to select the WL on which the page resides, and it also is used to select one particular sub-block, as the WL is shared among the sub-blocks of the block. The sub-block on which the page resides is decoded and that sub-block is selected. The address provided by the user device is used to turn on and off the selector device and access memory cells. In typical operations, one sub-block only is selected such that select devices of one sub-block are active.

Based on the address provided by the user device, the memory controller 1130 can select any one sub-block or all sub-blocks. The memory controller 1130 can generate the sub-block address to the sub-block drivers 1109 and select any one sub-block or all sub-blocks. The memory controller 1130 can send the WL information to the row decoder 1112 and a column address to the column decoder 1114.

The sub-block drivers 1109 can include a number of independent drivers that generate signals to select lines 1113 $SL_{0-0}$ ... $SL_{K-J}$. These select lines can be coupled to different select devices in different blocks. Multiple input signals can be assigned to each individual driver, depending on the different voltages designed for operation of the respective driver during erase operations, program operations, and read operations. From the sub-block drivers 1109, appropriate operational signals can be sent to the memory array 1102 via the select lines 1113 ($SL_{(sub-block\ \#)-(SGD\ \#\ or\ SGS\ \#)}$) $SL_{0-0}$ ... $SL_{K-J}$.

Figure 12:
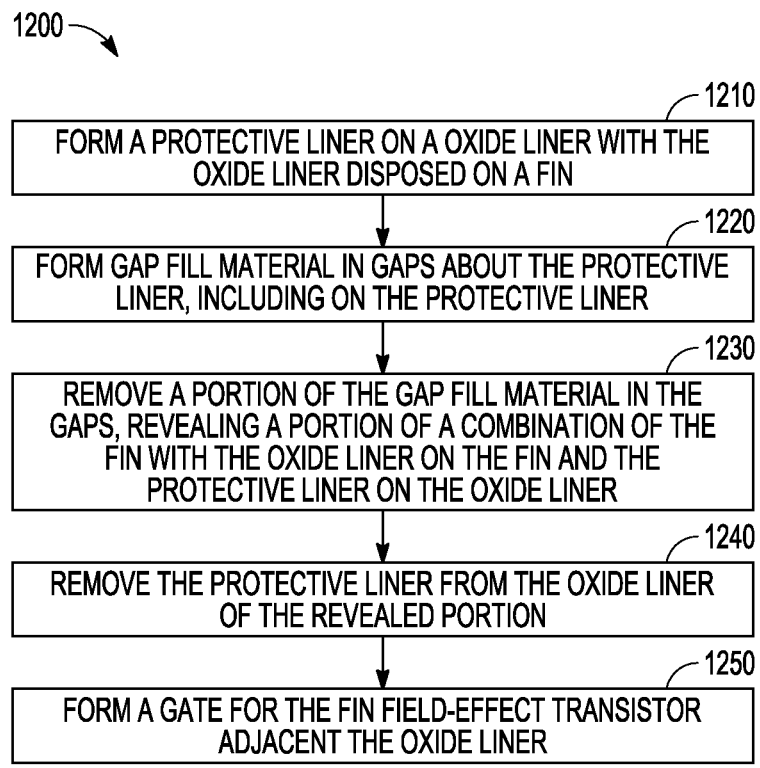
FIG. 12 is a flow diagram of features of an example method of forming a device having a fin field-effect transistor, in accordance with various embodiments.

FIG. 12 is a flow diagram of features of an embodiment of an example method 1200 of forming a device having a FinFET. At 1210, a protective liner is formed on an oxide liner with the oxide liner disposed on a fin. The fin can be disposed extending from a substrate for the fin. The protective liner can be a dielectric nitride. The oxide liner can be disposed on the fin by oxidation. The oxidation can provide the fin with a uniform composition, where the uniform composition is defined by the oxidation of the oxide liner. The oxidation can be performed by in situ steam generation or other oxidation procedure. Prior to formation of the oxide liner on the fin, the fin can be formed between shallow trench isolation regions and the shallow trench isolation regions can subsequently be removed such as by etching.

At 1220, gap fill material is formed in gaps about the protective liner, including on the protective liner. After forming the gap fill material in the gaps, the gap fill material can be subjected to chemical mechanical planarization prior to removing the portion of the gap fill material. At 1230, a portion of the gap fill material in the gaps is removed, revealing a portion of a combination of the fin with the oxide liner on the fin and the protective liner on the oxide liner. At 1240, the protective liner is removed from the oxide liner of the revealed portion.

At 1250, a gate for the FinFET is formed adjacent the oxide liner. Formation of the gate is conducted after removing the protective liner from the oxide liner of the revealed portion. The gate can be formed above a level of a remaining portion of the fin with the oxide liner on the fin and the protective liner on the oxide liner, where the remaining portion has been formed from removing the portion of the gap fill material. The gate can be a metal gate. The metal gate can include tungsten, titanium nitride, other metals, or combinations of metals.

Variations of method 1200 or methods similar to method 1200 can include a number of different embodiments that may be combined depending on the application of such methods and/or the architecture for devices in which such methods are implemented. Such methods can include forming a high-k dielectric on the oxide liner, after removing the protective liner from the oxide liner of the revealed portion and forming the gate on the high-k dielectric.

Figure 13:
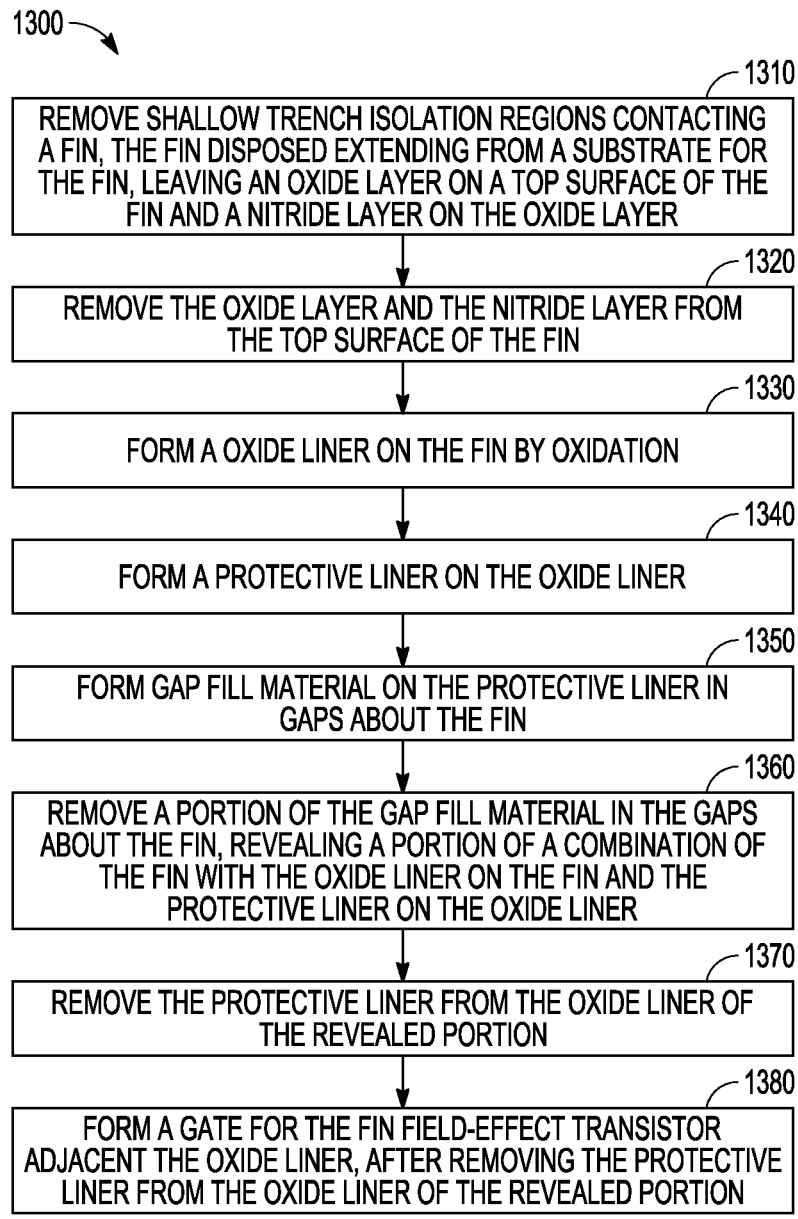
FIG. 13 is a flow diagram of features of another example method of forming a device having a fin field-effect transistor, in accordance with various embodiments.

FIG. 13 is a flow diagram of features of an embodiment of an example method 1300 of forming a device having a FinFET. At 1310, shallow trench isolation regions are removed from contacting a fin, leaving an oxide layer on a top surface of the fin and a nitride layer on the oxide layer. The fin can be disposed extending from a substrate for the fin. At 1320 the oxide layer and the nitride layer are removed from the top surface of the fin. At 1330, an oxide liner is formed on the fin by oxidation. The fin can be provided with a uniform composition, where the uniform composition is defined by the oxidation of the oxide liner. Forming the oxide liner on the fin by oxidation can include forming the oxide liner on the fin by rapid thermal oxidation.

At 1340, a protective liner is formed on the oxide liner. The protective liner can be a dielectric nitride. At 1350, gap fill material is formed on the protective liner in gaps about the fin. At 1360, a portion of the gap fill material in the gaps about the fin is removed, revealing a portion of a combination of the fin with the oxide liner on the fin and the protective liner on the oxide liner.

At 1370, the protective liner is removed from the oxide liner of the revealed portion. At 1380, a gate for the FinFET is formed adjacent the oxide liner, after removing the protective liner from the oxide liner of the revealed portion. The gate can be formed above a level of a remaining portion of the fin with the oxide liner on the fin and the protective liner on the oxide liner, where the remaining portion was formed from removing the portion of the gap fill material in the gaps.

Variations of method 1300 or methods similar to method 1300 can include a number of different embodiments that may be combined depending on the application of such methods and/or the architecture for devices in which such methods are implemented. Such methods can include forming a high-k dielectric on the oxide liner, after removing the protective liner from the oxide liner of the revealed portion, and forming the gate on the high-k dielectric.

In various embodiments, an electronic device can comprise a FinFET. The FinFET can include a fin disposed extending vertically from a substrate for the fin, with an oxide liner on the fin from the substrate to a top of the fin, including on the top of the fin. The FinFET can include a protective liner on a portion of the oxide liner, where the protective liner extends vertically from the substrate and has a top level below the top of the fin. A gate adjacent the oxide liner can extend vertically above the top level of the protective liner. The fin can have a thickness of uniform composition defined by in situ steam generation or rapid thermal oxidation of the oxide.

Variations of such an electronic device or similar electronic devices can include a number of different embodiments that may be combined depending on the application of such electronic devices and/or the architecture in which such electronic devices are implemented. Such electronic devices can include the protective liner of the FinFET being a dielectric nitride. The FinFET can include a high-k dielectric disposed on the oxide liner with the gate on the high-k dielectric for the FinFET. Variations can include the FinFET arranged as one of multiple FinFETs, where each FinFET of the multiple FinFETs has a common structure. The FinFET can be disposed in a peripheral region to a memory array of a dynamic random-access memory.

A machine-readable storage device storing instructions, that when executed by one or more processors, can cause a machine to perform operations, where the instructions include operations to control instrumentality to form a thick gate oxide FinFET as discussed with respect to FIGS. 1-13.

A machine-readable storage device storing instructions, that when executed by one or more processors, can cause a machine to perform operations, where the instructions include operations to simulate a thick gate oxide FinFET as discussed with respect to FIGS. 1-13 or components of the thick gate oxide FinFET, or to simulate performance of the operations of the thick gate oxide FinFETs in a selected system and methods disclosed herein.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. In addition, electronic devices can be broken down into several main components: a processor (e.g., a central processing unit (CPU) or other main processor); memory (e.g., one or more volatile or non-volatile RAM memory devices, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 14:
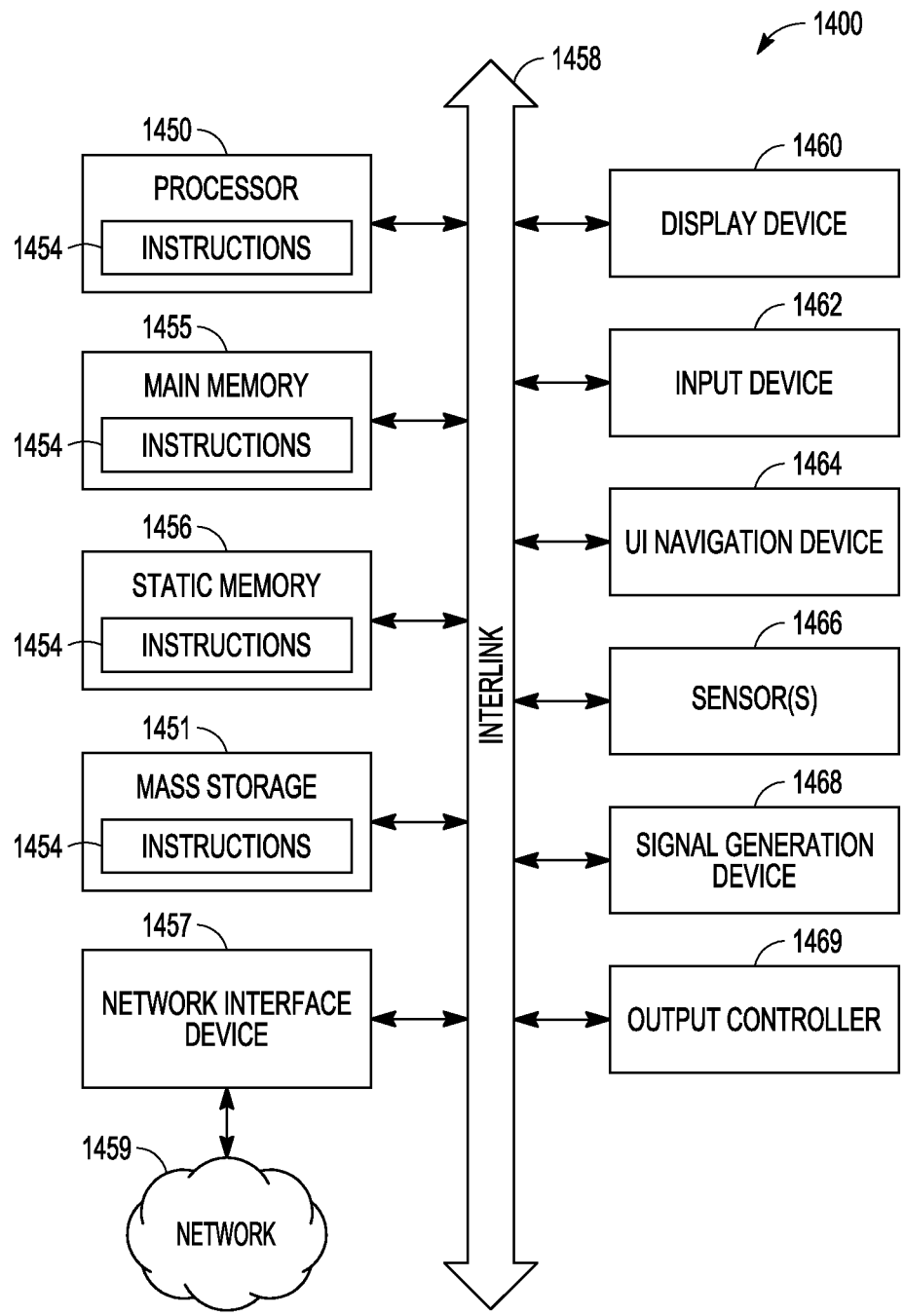
FIG. 14 is a block diagram illustrating an example of a machine in which one or more fin field-effect transistors may be implemented, in accordance with various embodiments.

FIG. 14 illustrates a block diagram of an example machine 1400 upon which any one or more of the techniques (e.g., methodologies) discussed herein may performed to implement formation of a thick oxide FinFET as discussed with respect to FIGS. 1-13, with the fabricated FinFET used within machine 1400. In alternative embodiments, machine 1400 may operate as a standalone device or may be connected (e.g., networked) to other machines. In a networked deployment, machine 1400 may operate in the capacity of a server machine, a client machine, or both in server-client network environments. In an example, machine 1400 may act as a peer machine in peer-to-peer (P2P) (or other distributed) network environment. Machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform one or more methodologies, such as cloud computing, software as a service (SaaS), other computer cluster configurations. The example machine 1400 can include devices having one or more thick oxide FinFETs as discussed with respect to FIGS. 1-13.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation.

Machine 1400 may include a hardware processor 1450 (e.g., a CPU, a GPU, a hardware processor core, or any combination thereof), a main memory 1455, and a static memory 1456, some or all of which may communicate with each other via an interlink 1458 (e.g., bus). Machine 1400 may further include a display device 1460, an input device 1462, which can be an alphanumeric input device (e.g., a keyboard), and a user interface (UI) navigation device 1464 (e.g., a mouse). In an example, display device 1460, input device 1462, and UI navigation device 1464 may be a touch screen display. Machine 1400 may additionally include a mass storage device (e.g., drive unit) 1451, a signal generation device 1468, a network interface device 1457, and one or more sensors 1466, such as a global positioning system (GPS) sensor, compass, accelerometer, or other sensor. Machine 1400 may include an output controller 1469, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 1400 can store one or more sets of data structures or instructions 1454 (e.g., software) embodying or utilized by machine 1400 to perform any one or more of the techniques or functions for which machine 1400 is designed. Instructions 1454 may also reside, completely or at least partially, within main memory 1455, within static memory 1456, or within hardware processor 1450 during execution thereof by machine 1400.

Instructions 1454 (e.g., software, programs, an operating system (OS), etc.) or other data can be stored on mass storage device 1451 or can be accessed by main memory 1455 for use by hardware processor 1450. Main memory 1455 (e.g., DRAM) is typically fast, but volatile, and thus a different type of storage than mass storage device 1451 (e.g., an SSD), which is suitable for long-term storage, including while in an "off" condition. Instructions 1454 or data in use by a user or machine 1400 are typically loaded in main memory 1455 for use by hardware processor 1450. When main memory 1455 is full, virtual space from mass storage device 1451 can be allocated to supplement main memory 1455; however, because mass storage device 1451 is typically slower than main memory 1455, and write speeds are typically at least twice as slow as read speeds, use of virtual memory can greatly reduce user experience due to storage device latency (in contrast to main memory 1455, e.g., DRAM). Further, use of mass storage device 1451 for virtual memory can greatly reduce the usable lifespan of mass storage device 1451.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 1454 can be transmitted or received over a network 1459 using a transmission medium via signal generation device 1468 or network interface device 1457 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, signal generation device 1468 or network interface device 1457 may include one or more physical jacks (e.g., Ethernet, coaxial, or phone jacks) or one or more antennas to connect to network 1459. In an example, signal generation device 1468 or network interface device 1457 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 1400, and includes instrumentalities to propagate digital or analog communications signals to facilitate communication of such instructions, which instructions may be implemented by software.

The following are example embodiments of methods and electronic devices, in accordance with the teachings herein.

An example method 1 of forming a device having a FinFET can comprise forming a protective liner on an oxide liner with the oxide liner disposed on a fin, the fin disposed extending from a substrate for the fin; forming gap fill material in gaps about the protective liner, including on the protective liner; removing a portion of the gap fill material in the gaps, revealing a portion of a combination of the fin with the oxide liner on the fin and the protective liner on the oxide liner; removing the protective liner from the oxide liner of the revealed portion; and forming a gate for the FinFET adjacent the oxide liner, after removing the protective liner from the oxide liner of the revealed portion.

An example method 2 of forming a device having a FinFET can include features of example method 1 of forming a device having a FinFET and can include forming the gate above a level of a remaining portion of the fin with the oxide liner on the fin and the protective liner on the oxide liner, the remaining portion formed from removing the portion of the gap fill material.

An example method 3 of forming a device having a FinFET can include features of any of the preceding example methods of forming a device having a FinFET and can include the protective liner being a dielectric nitride.

An example method 4 of forming a device having a FinFET can include features of any of the preceding example methods of forming a device having a FinFET and can include forming a high-k dielectric on the oxide liner, after removing the protective liner from the oxide liner of the revealed portion; and forming the gate on the high-k dielectric.

An example method 5 of forming a device having a FinFET can include features of any of the preceding example methods of forming a device having a FinFET and can include, prior to formation of the oxide liner on the fin, forming the fin between shallow trench isolation regions; and etching the shallow trench isolation regions.

An example method 6 of forming a device having a FinFET can include features of any of the preceding example methods of forming a device having a FinFET and can include, after forming the gap fill material in the gaps, subjecting the gap fill material to chemical mechanical planarization prior to removing the portion of the gap fill material.

An example method 7 of forming a device having a FinFET can include features of any of the preceding example methods of forming a device having a FinFET and can include forming the oxide liner disposed on the fin by oxidation.

An example method 8 of forming a device having a FinFET can include features of example method 7 of forming a device having a FinFET and features of any of the preceding example methods of forming a device having a FinFET and can include forming the oxide liner by in situ steam generation.

In an example method 9, any of the example methods 1 to 8 may be performed for an electronic memory apparatus comprising a host processor and a communication bus extending between the host processor and the electronic device.

In an example method 10, any of the example methods 1 to 9 may be modified to include operations set forth in any other of method examples 1 to 9.

In an example method 11, any of the example methods 1 to 10 may be implemented at least in part through use of instructions stored as a physical state in one or more machine-readable storage devices.

An example method 12 can include features of any of the preceding example methods 1 to 11 and can include performing functions associated with any features of example electronic devices 1 to 6.

An example method 13 of forming a device having a FinFET can comprise removing shallow trench isolation regions contacting a fin, the fin disposed extending from a substrate for the fin, leaving an oxide layer on a top surface of the fin and a nitride layer on the oxide layer; removing the oxide layer and the nitride layer from the top surface of the fin; forming an oxide liner on the fin by oxidation; forming a protective liner on the oxide liner; forming gap fill material on the protective liner in gaps about the fin; removing a portion of the gap fill material in the gaps about the fin, revealing a portion of a combination of the fin with the oxide liner on the fin and the protective liner on the oxide liner; removing the protective liner from the oxide liner of the revealed portion; and forming a gate for the FinFET adjacent the oxide liner, after removing the protective liner from the oxide liner of the revealed portion.

An example method 14 of forming a device having a FinFET can include features of example method 13 of forming a device having a FinFET and can include forming the gate above a level of a remaining portion of the fin with the oxide liner on the fin and the protective liner on the oxide liner, the remaining portion formed from removing the portion of the gap fill material in the gaps.

An example method 15 of forming a device having a FinFET can include features of any of the preceding example methods of forming a device having a FinFET and can include the protective liner being a dielectric nitride.

An example method 16 of forming a device having a FinFET can include features of any of the preceding example methods of forming a device having a FinFET and can include forming a high-k dielectric on the oxide liner, after removing the protective liner from the oxide liner of the revealed portion; and forming the gate on the high-k dielectric.

An example method 17 of forming a device having a FinFET can include features of any of the preceding example methods of forming a device having a FinFET and can include forming the oxide liner on the fin by oxidation to include forming the oxide liner on the fin by rapid thermal oxidation.

An example method 18 of forming a device having a FinFET can include features of any of the preceding example methods of forming a device having a FinFET and can include forming the oxide liner on the fin by oxidation providing the fin with a composition uniform within a threshold level of uniformity, uniformity of the composition defined by the oxidation of the oxide liner.

In an example method 19, any of the example methods 13 to 18 may be performed for an electronic memory apparatus comprising a host processor and a communication bus extending between the host processor and the electronic device.

In an example method 20, any of the example methods 13 to 19 may be modified to include operations set forth in any other of method examples 1 to 19.

In an example method 21, any of the example methods 13 to 19 may be implemented at least in part through use of instructions stored as a physical state in one or more machine-readable storage devices.

An example method 22 can include features of any of the preceding example methods 13 to 21 and can include performing functions associated with any features of example electronic devices 1 to 6.

An example electronic device 1 can comprise: a FinFET having: a fin disposed extending vertically from a substrate for the fin; an oxide liner on the fin from the substrate to a top of the fin, including on the top of the fin; a protective liner on a portion of the oxide liner, the protective liner extending vertically from the substrate, the protective liner having a top level below the top of the fin; and a gate adjacent the oxide liner, the gate extending vertically above the top level of the protective liner.

An example electronic device 2 can include features of example electronic device 1 and can include the FinFET having a high-k dielectric disposed on the oxide liner with the gate on the high-k dielectric.

An example electronic device 3 can include features of any of the preceding example electronic devices and can include the protective liner being a dielectric nitride.

An example electronic device 4 can include features of any of the preceding example electronic devices and can include the fin having a thickness of a composition uniform within a threshold level of uniformity, uniformity of the composition defined by in situ steam generation or rapid thermal oxidation of the oxide.

An example electronic device 5 can include features of any of the preceding example electronic devices and can include features of any of the preceding example electronic devices and can include the FinFET being one of multiple FinFETs, each FinFET of the multiple FinFETs having a common structure.

An example electronic device 6 can include features of any of the preceding example electronic devices and can include the FinFET being disposed in a peripheral region to a memory array of a dynamic random-access memory.

In an example electronic device 7, any of the electronic devices of example electronic devices 1 to 6 may include electronic devices incorporated into an electronic memory apparatus further comprising a host processor and a communication bus extending between the host processor and the electronic device.

In an example electronic device 8, any of the electronic devices of example electronic devices 1 to 7 may be modified to include any structure presented in another of example electronic device 1 to 7.

In an example electronic device 9, any of the electronic devices of example electronic devices 1 to 8 may be modified to include any structure presented in another of example electronic device 1 to 8.

In an example electronic device 10, any apparatus associated with the electronic devices of example electronic devices 1 to 9 may further include a machine-readable storage device configured to store instructions as a physical state, wherein the instructions may be used to perform one or more operations of the apparatus.

In an example electronic device 11, any of the electronic devices of example electronic devices 1 to 10 may be formed in accordance with any of the methods of the above example methods 1 to 22.

Although specific embodiments have been illustrated and described herein, any arrangement that is calculated to achieve the same purpose may be substituted for the specific embodiments shown. Various embodiments can use permutations and/or combinations of embodiments described herein. The above description is intended to be illustrative, and not restrictive, and that the phraseology or terminology employed herein is for the purpose of description.

What is claimed is:

1. A method of forming a device having a fin field-effect transistor, the method comprising:
    forming a protective liner on an oxide liner with the oxide liner disposed on and contacting sides and top of a fin, the fin disposed extending from a substrate for the fin;
    forming gap fill material in gaps about the protective liner, including on the protective liner;
    removing a portion of the gap fill material in the gaps, revealing a portion of a combination of the fin with the oxide liner on the fin and the protective liner on the oxide liner;
    removing the protective liner from the oxide liner of the revealed portion; portion, and maintaining the oxide liner on and contacting the sides and top of the fin; and
    forming a gate for the fin field-effect transistor adjacent the oxide liner, after removing the protective liner from the oxide liner of the revealed portion.

2. The method of claim 1, wherein the method includes forming the gate above a level of a remaining portion of the fin with the oxide liner on the fin and the protective liner on the oxide liner, the remaining portion formed from removing the portion of the gap fill material.

3. The method of claim 1, wherein the protective liner is a dielectric nitride.

4. The method of claim 1, wherein the method includes:
    forming a high-k dielectric on the oxide liner, after removing the protective liner from the oxide liner of the revealed portion; and
    forming the gate on the high-k dielectric.

5. The method of claim 1, wherein the method includes, prior to formation of the oxide liner on the fin:
    forming the fin between shallow trench isolation regions; and
    etching the shallow trench isolation regions.

6. The method of claim 1, wherein the method includes, after forming the gap fill material in the gaps, subjecting the gap fill material to chemical mechanical planarization prior to removing the portion of the gap fill material.

7. The method of claim 1, wherein the method includes forming the oxide liner disposed on the fin by oxidation.

8. The method of claim 7, wherein forming the oxide liner disposed on the fin by oxidation includes forming the oxide liner by in situ steam generation.

9. A method of forming a device having a fin field-effect transistor, the method comprising:
    removing shallow trench isolation regions contacting a fin, the fin disposed extending from a substrate for the fin, leaving an oxide layer on a top surface of the fin and a nitride layer on the oxide layer;
    removing the oxide layer and the nitride layer from the top surface of the fin;
    forming an oxide liner on the fin by oxidation;
    forming a protective liner on the oxide liner;
    forming gap fill material on the protective liner in gaps about the fin;
    removing a portion of the gap fill material in the gaps about the fin, revealing a portion of a combination of the fin with the oxide liner on the fin and the protective liner on the oxide liner;
    removing the protective liner from the oxide liner of the revealed portion; and
    forming a gate for the fin field-effect transistor adjacent the oxide liner, after removing the protective liner from the oxide liner of the revealed portion.

10. The method of claim 9, wherein the method includes forming the gate above a level of a remaining portion of the fin with the oxide liner on the fin and the protective liner on the oxide liner, the remaining portion formed from removing the portion of the gap fill material in the gaps.

11. The method of claim 9, wherein the protective liner is a dielectric nitride.

12. The method of claim 9, wherein the method includes:
    forming a high-k dielectric on the oxide liner, after removing the protective liner from the oxide liner of the revealed portion; and
    forming the gate on the high-k dielectric.

13. The method of claim 9, wherein forming the oxide liner on the fin by oxidation includes forming the oxide liner on the fin by rapid thermal oxidation.

14. The method of claim 9, wherein forming the oxide liner on the fin by oxidation provides the fin with a uniform composition, the uniform composition defined by the oxidation of the oxide liner.

15. The method of claim 1, wherein the protective liner on and contacting the top of the fin is composed of a material different from material of the protective liner on and contacting the sides of the fin.

16. The method of claim 1, wherein the oxide liner includes silicon oxide.

17. The method of claim 1, wherein the method includes forming the fin field-effect transistor in a peripheral region to a memory array of a memory device.

18. The method of claim 9, wherein the protective liner is formed by chemical vapor deposition or atomic layer deposition.

19. The method of claim 9, wherein the fin includes silicon.

20. The method of claim 9, wherein the method includes:
    forming the fin field-effect transistor in a peripheral region to a memory array of a dynamic random-access memory; and
    forming the oxide liner on the fin by oxidation in the peripheral region with a thickness that is thick relative to gate oxides for fin field-effect transistors for memory cell capacitors of the random-access memory.

* * * * *